United States Patent
Ueda

(10) Patent No.: US 7,026,703 B2
(45) Date of Patent: Apr. 11, 2006

(54) THIN-FILM CAPACITOR ELEMENT WITH REDUCED INDUCTANCE COMPONENT

(75) Inventor: Kazuhiko Ueda, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/690,352

(22) Filed: Oct. 21, 2003

(65) Prior Publication Data

US 2004/0080023 A1 Apr. 29, 2004

(30) Foreign Application Priority Data

Oct. 28, 2002 (JP) ............................ 2002-312813

(51) Int. Cl.
- *H01L 29/76* (2006.01)
- *H01L 29/94* (2006.01)
- *H01L 31/062* (2006.01)
- *H01L 31/113* (2006.01)
- *H01L 31/119* (2006.01)

(52) U.S. Cl. ...................................... 257/532; 257/296
(58) Field of Classification Search ................ 257/309, 257/296–306, 532
See application file for complete search history.

(56) References Cited

U.S. PATENT DOCUMENTS

| | | | | |
|---|---|---|---|---|
| 4,959,705 A | * | 9/1990 | Lemnios et al. | 257/532 |
| 5,208,726 A | * | 5/1993 | Apel | 257/532 |
| 5,712,759 A | * | 1/1998 | Saenger et al. | 361/321.4 |
| 5,825,609 A | * | 10/1998 | Andricacos et al. | 361/321.4 |
| 5,925,921 A | * | 7/1999 | Susak | 257/532 |
| 6,096,631 A | * | 8/2000 | Nakamura et al. | 438/597 |
| 6,384,446 B1 | * | 5/2002 | Lee et al. | 257/309 |
| 6,387,751 B1 | | 5/2002 | Tominaga | |
| 6,399,974 B1 | * | 6/2002 | Ohtsuki | 257/296 |
| 6,469,331 B1 | * | 10/2002 | Gerhard | 257/275 |
| 6,477,054 B1 | * | 11/2002 | Hagerup | 361/720 |
| 6,498,386 B1 | * | 12/2002 | Pan | 257/532 |
| 6,576,945 B1 | * | 6/2003 | Mandelman et al. | 257/301 |
| 2003/0034542 A1 | * | 2/2003 | Okumura | 257/508 |
| 2003/0218185 A1 | * | 11/2003 | Ohbu et al. | 257/197 |
| 2004/0212002 A1 | * | 10/2004 | Yang et al. | 257/306 |
| 2005/0023640 A1 | * | 2/2005 | Choi et al. | 257/532 |

FOREIGN PATENT DOCUMENTS

JP 2001-339243 12/2001

* cited by examiner

*Primary Examiner*—Kenneth Parker
*Assistant Examiner*—Jesse A. Fenty
(74) *Attorney, Agent, or Firm*—Brinks Hofer Gilson & Lione

(57) ABSTRACT

A conductive material such as silver is charged in a via hole of an insulative substrate made of low-temperature-sintered ceramic. A lower electrode, a dielectric layer, and an upper electrode are formed in a thin film on the insulative substrate. Thus a thin-film capacitor element is formed in which the capacitance value of the capacitor is specified by the overlapping part of the lower electrode and the upper electrode opposed through the dielectric layer. The dielectric layer is shaped like a ring with the via hole (conductive material) as the center and the part exposed inward from the inner periphery of the dielectric layer is served as a lead section of the lower electrode. The lead section is connected to a ground electrode on the back of the insulative substrate through the conductive material.

6 Claims, 3 Drawing Sheets

THIN-FILM CAPACITOR ELEMENT WITH REDUCED INDUCTANCE COMPONENT

This application claims the benefit of priority to Japanese Patent Application 2002-312813, which was filed on Oct. 28, 2002.

BACKGROUND OF THE INVENTION

1. Field of the Invention

The present invention relates to a thin-film capacitor element suitable for use particularly in a high frequency circuit among various electronic circuits.

2. Description of the Related Art

Electronic circuits are becoming increasingly smaller with the development of integrated circuit techniques. Accordingly, compact electronic circuit units have been proposed which have thin-film circuit elements, such as resistors, capacitors, and inductors, on an insulative substrate.

Among the circuit elements, known general thin-film capacitor elements (thin film capacitors) are formed by successively laying a lower electrode, a dielectric layer, and an upper electrode on an alumina substrate (for example, refer to Patent Document 1). The lower electrode is formed by sputtering chromium or copper on the alumina substrate and etching it into a desired pattern. The dielectric layer is formed by sputtering silicon dioxide or the like onto the lower electrode and etching it into a desired pattern. The upper electrode is formed by sputtering chromium or copper on the dielectric layer and etching it into a desired pattern. When the thin-film capacitor is used as a grounding capacitor, either one of the lower electrode and the upper electrode of the thin-film capacitor is routed to the outer rim of the alumina substrate and is connected to a ground electrode formed on the back of the alumina substrate through an end electrode.

[Patent Document 1]

Japanese Unexamined Published Patent Application No. 2001-339243 (pp. 5–6, FIG. 8)

The above-described known art requires a wiring pattern with a specified length to connect the thin-film capacitor formed on the surface of the alumina substrate to the ground electrode on the back. Therefore, the wiring pattern causes an inductance component to be increased, thus having the problem of increasing impedance loss when used in a high frequency circuit. Accordingly, a thin-film capacitor has been proposed in which either one of the lower electrode and the upper electrode is connected to the ground electrode through the use of a via hole in the alumina substrate.

FIG. 5 is a plan view of the known thin-film capacitor element; and FIG. 6 is a cross-sectional view taken along line VI—VI of FIG. 5. As shown in the drawings, a via hole 10a in an alumina substrate 10 is filled with a conductive material 11 such as silver paste and the lower end of the conductive material 11 is in conduction with a ground electrode 12 formed on the back of the alumina substrate 10. The thin-film capacitor element formed on the surface of the alumina substrate 10 has a multilayer structure of a lower electrode 13, a dielectric layer 14, and an upper electrode 15. The lower electrode 13 is in conduction with the top of the conductive material 11 in the position out of the multilayer structure.

In the thin-film capacitor element with such a structure, the lower electrode 13 connects to the ground electrode 12 through the conductive material 11 charged in the via hole 10a. Therefore, the inductance component can be reduced to a certain extent as compared with that with a long wiring pattern. However, the end face of the conductive material 11 made of silver paste or the like has seriously lower flatness than the surface of the alumina substrate 10. Therefore the part conducting between the lower electrode 13 and the conductive material 11 needs to be sufficiently separated from the part overlapping with the upper electrode 15 which specifies the capacitance value of the capacitor; the length of the lead section therebetween disadvantageously prevents further reduction in the inductance component.

SUMMARY OF THE INVENTION

The present invention has been made in view of the problems of the known art. Accordingly, it is an object of the invention to provide a thin-film capacitor element with a reduced inductance component of the part connecting to a via hole.

In order to achieve the above object, a thin-film capacitor element according to the invention includes an insulative substrate having a via hole filled with a conductive material; and a lower electrode, a dielectric layer, and an upper electrode which are deposited in order on the insulative substrate. Either one of the lower electrode and the upper electrode connects to the end face of the conductive material; and the dielectric layer is shaped like a ring to surround the via hole.

The thin-film capacitor element with such a structure has the dielectric layer shaped like a ring to surround the via hole. Thus the distance from the overlapping part of the upper electrode and the lower electrode which specifies the capacitance value of the capacitor to the via hole is short, so that the inductance component of the part connecting to the via hole can be reduced.

With the above structure, the dielectric layer is more preferably shaped like a ring with the via hole as the center, because the distance from the overlapping part of the upper electrode and the lower electrode which specifies the capacitance value of the capacitor to the via hole is equal entirely in the circumferential direction.

With the above structure, the insulative substrate may be an alumina substrate. However, it is preferably a low-temperature-sintered ceramic substrate with higher surface smoothness than that of the alumina substrate and, more preferably, it is made of low-temperature co-fired ceramics (LTCC) having a necessary number of low-temperature-sintered ceramics layers with a via hole.

DESCRIPTION OF THE PREFERRED EMBODIMENTS

Figure 1:
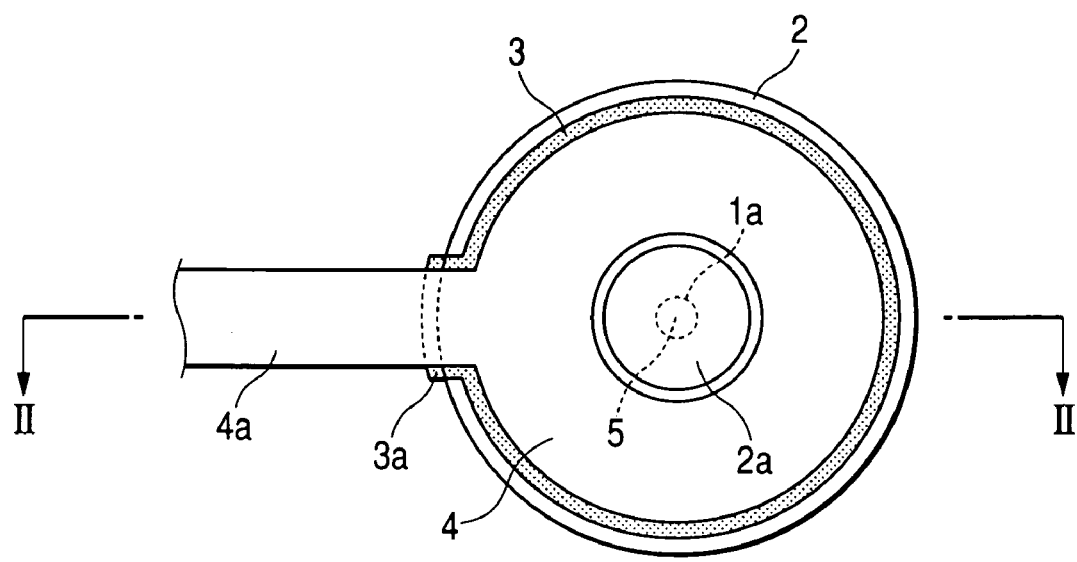
FIG. 1 is a plan view of a thin-film capacitor element according to a first embodiment of the present invention.

Embodiments of the present invention will be described with reference to the drawings. FIG. 1 is a plan view of a thin-film capacitor element according to a first embodiment of the present invention; and FIG. 2 is a cross-sectional view taken along line II—II of FIG. 1.

Figure 2:
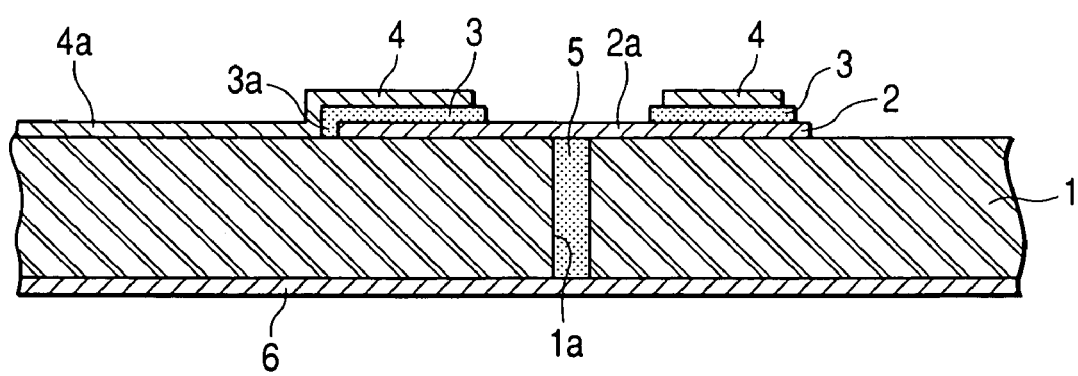
FIG. 2 is a cross-sectional view taken along line II—II of FIG. 1.

As FIGS. 1 and 2 shows, the thin-film capacitor element according to the embodiment includes a lower electrode 2, a dielectric layer 3, and an upper electrode 4, which are deposited in order on an insulative substrate 1 having a via hole 1a. The upper and lower ends of a conductive material 5 charged in the via hole 1a are in conduction with the lower electrode 2 on the surface of the insulative substrate 1 and a ground electrode 6 on the back, respectively.

The insulative substrate 1 is made of low-temperature-sintered ceramic, such as a mixture of ceramic and crystallized glass, and is formed by sintering a green sheet obtained by mixing these materials at about 900° C. The conductive material 5 is made of silver, gold, or an alloy of silver and palladium. The low-temperature-sintered ceramic substrate of this embodiment is obtained by charging silver paste into the via hole 1a in the green sheet and sintering the silver paste simultaneously with the green sheet. Thus the low-temperature-sintered ceramic substrate has the advantages that the conductive material 5 in the via hole 1a can be sintered simultaneously when the green sheet is sintered and the surface roughness after the sintering can be decreased through the use of the mixed glass (Ra≅12.5 nm).

The lower electrode 2 is formed by sputtering chromium or copper on the insulative substrate 1 and etching it into a circular thin film. The upper end of the conductive material 5 is connected to the lower surface of the lower electrode 2 and in the center thereof. In this case, since the insulative substrate (low-temperature-sintered ceramic substrate) 1 has high surface smoothness, as described above, the lower electrode 2 can be formed without polishing the surface. However, the lower electrode 2 may be formed after polishing the surface of the insulative substrate 1 as necessary. The dielectric layer 3 is formed by sputtering silicon oxide or the like on the lower electrode 2 and etching it into a ring-shaped thin film. The lower electrode 2 has a circular lead section 2a exposed from the inner periphery of the dielectric layer 3. The dielectric layer 3 has a step 3a, which passes on the side of the lower electrode 2 to reach the top of the insulative substrate 1, at the outer periphery, and has the conductive material 5 in the center of the inner periphery. The upper electrode 4 is formed by sputtering chromium or copper on the dielectric layer 3 and etching it into a ring-shaped thin film. The upper electrode 4 has a lead section 4a which passes on the step 3a of the dielectric layer 3 toward the top of the insulative substrate 1. The lead 4a connects to other circuit elements and wiring patterns (not shown).

The ground electrode 6 is formed by sputtering chromium or copper on the back of the insulative substrate 1 and etching it into a thin film with a desired shape. The lower end of the conductive material 5 connects to the ground electrode 6. It is also possible to form the ground electrode 6 by printing conductive paste of silver, gold, or an alloy of silver and palladium on the back of the green sheet and then sintering it when forming the insulative substrate (low-temperature-sintered ceramic substrate) 1. This offers the advantage in production that the via hole 1a (conductive material 5) and the ground electrode 6 are simultaneously formed when the green sheet is sintered.

In the thin-film capacitor element with such an arrangement, the capacitance value of the capacitor is specified by the overlapping part of the lower electrode 2 and the upper electrode 4 which are opposed through the dielectric layer 3, and the part of the lower electrode 2 exposed inward from the inner peripheries of the dielectric layer 3 and the upper electrode 4 serves as the lead section 2a; and the lead section 2a serves as a grounding capacitor connected to the ground electrode 6 through the conductive material 5. Since the dielectric layer 3 of the thin-film capacitor element is formed in the shape of a ring with the via hole 1a (conductive material 5) as the center, the lead section 2a from the overlapping part of the lower electrode 2 and the upper electrode 4 to the via hole 1a is short entirely in the circumferential direction. As a result, the inductance component of the lead section 2a of the lower electrode 2 which connects the thin-film capacitor element to the via hole 1a is significantly decreased; thus impedance loss when the thin-film capacitor element is applied to a high frequency circuit can be greatly reduced.

Figure 3:
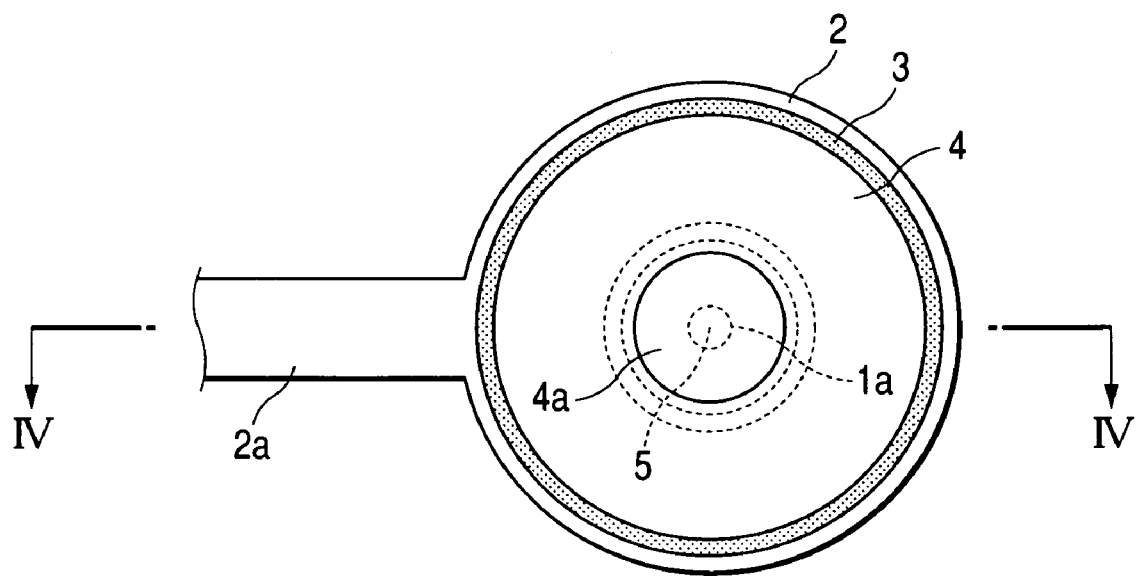
FIG. 3 is a plan view of a thin-film capacitor element according to a second embodiment of the present invention.
Figure 4:
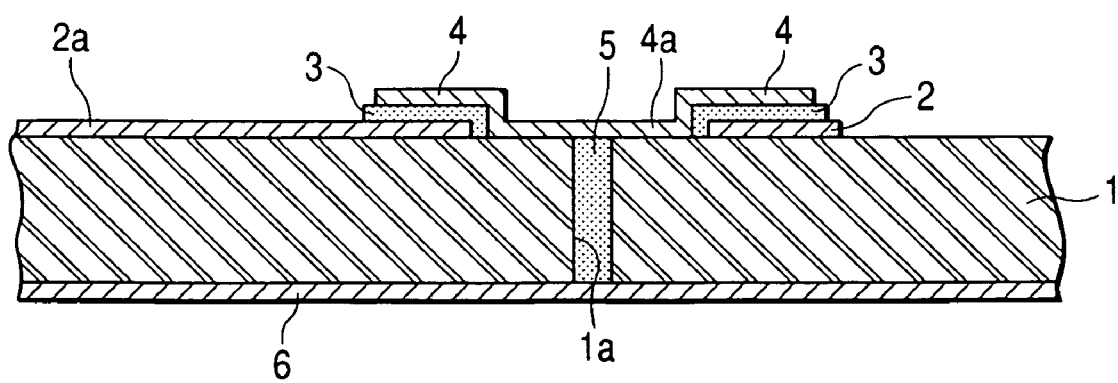
FIG. 4 is a cross-sectional view taken along line IV—IV of FIG. 3.
Figure 5:
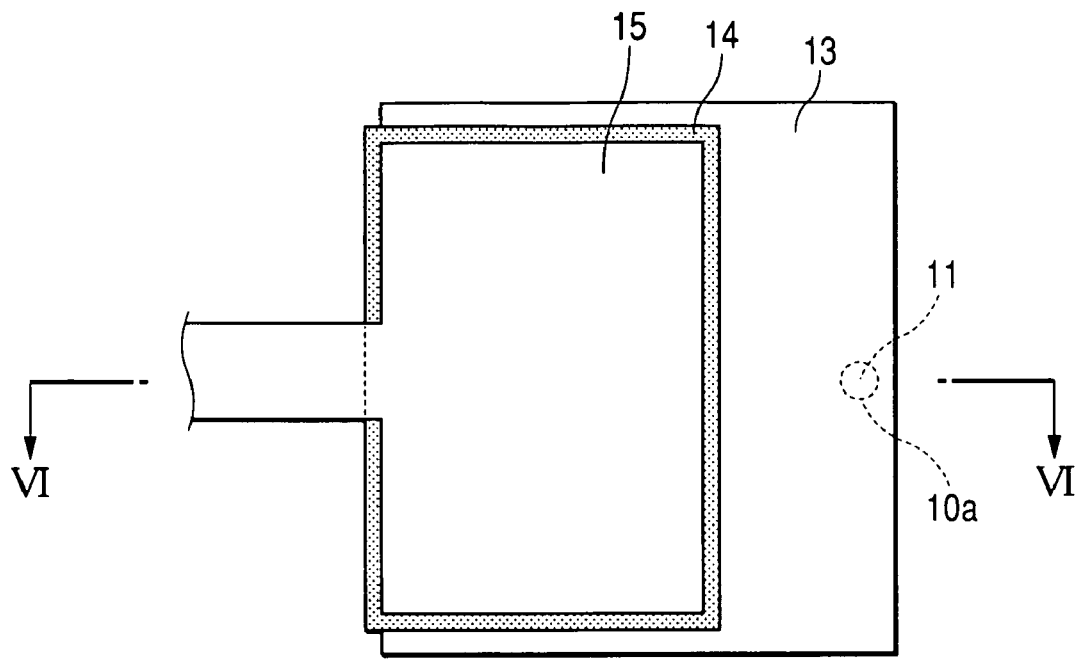
FIG. 5 is a plan view of a thin-film capacitor element according to a known art.
Figure 6:
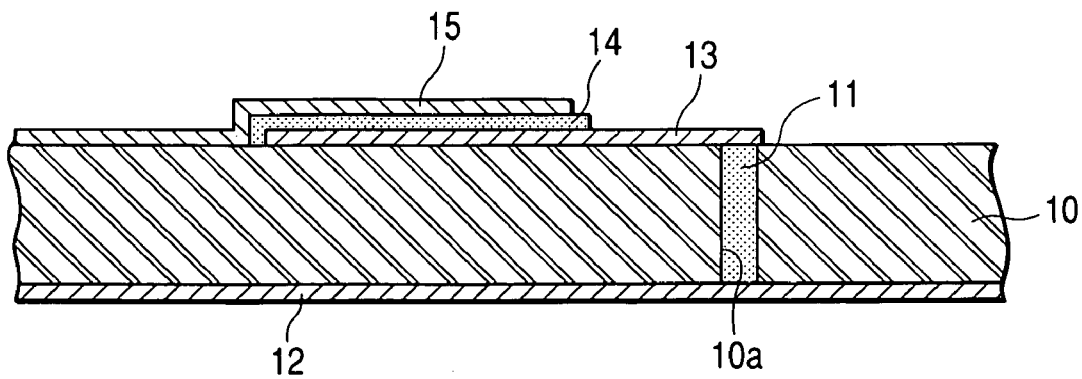
FIG. 6 is a cross-sectional view taken along line VI—VI of FIG. 5.

FIG. 3 is a plan view of a thin-film capacitor element according to a second embodiment of the present invention; and FIG. 4 is a cross-sectional view taken along line IV—IV of FIG. 3, wherein components corresponding to those of FIGS. 1 and 2 are given the same reference numerals.

The difference between the first embodiment and the second embodiment is that among the lower electrode 2 and the upper electrode 4 of the thin-film capacitor element, a lead section 4a of the upper electrode 4 connects to the ground electrode 6 through the conductive material 5 and the other arrangements are basically the same. More specifically, the thin-film capacitor element according to the second embodiment is the same as that of the first embodiment in that the capacitance value of the capacitor is specified by the overlapping part of the lower electrode 2 and the upper electrode 4 opposed through the ring-shaped dielectric layer 3. However, in contrast to the first embodiment, the lead section 2a extending from the outer periphery of the lower electrode 2 to the top of the insulative substrate 1 connects to other circuit elements and wiring patterns (not shown); and the lead section 4a of the upper electrode 4 exposed inward from the inner peripheries of the lower electrode 2 and the dielectric layer 3 serves as a grounding capacitor connected through the conductive material 5 to the ground electrode 6.

Also in the thin-film capacitor element with such a structure, the dielectric layer 3 of the thin-film capacitor element is formed in the shape of a ring with the via hole 1a (conductive material 5) as the center, so that the lead section 4a from the overlapping part of the lower electrode 2 and the upper electrode 4 to the via hole 1a is short entirely in the circumferential direction. As a result, the inductance component of the lead section 4a of the upper electrode 4 which connects the thin-film capacitor element to the via hole 1a is decreased significantly; thus impedance loss when the thin-film capacitor element is applied to a high frequency circuit can be greatly reduced.

While the embodiments have been described with a thin-film capacitor element formed on a single-layer insulative substrate as an example, it is preferable to apply such a thin-film capacitor element to a low-temperature co-fired ceramic (LTCC) substrate so as to achieve a high-density mounting electronic circuit module.

While the embodiments have been described with the dielectric layer of the thin-film capacitor element formed in a ring shape as an example, the dielectric layer may have a polygonal outer periphery such as a rectangle or a hexagon in plan view if only it is formed in a ring shape to surround the via hole.

The present invention is embodied as described above and offers the following advantages.

Either one of the lower electrode and the upper electrode of the thin-film capacitor element is connected to the end face of the conductive material charged in the via hole and the dielectric layer is formed in a ring shape so as to surround the via hole. Thus the distance from the overlapping part of the upper electrode and the lower electrode to the via hole, which specifies the capacitance value of the capacitor, is short, so that the inductance component of the part connecting to the via hole can be reduced.

What is claimed is:

1. A thin-film capacitor element comprising:
    an insulative substrate having a via hole filled with a conductive material;
    a lower electrode;
    a dielectric layer; and
    an upper electrode;
    wherein the lower electrode, the dielectric layer on the lower electrode, and the upper electrode on the dielectric layer are disposed on the insulative substrate, at least a portion of the upper and lower electrodes overlap with the dielectric layer therebetween in a direction perpendicular to a face of the substrate, the upper electrode connects to an end face of the conductive material in an area not having a dielectric layer; and
    the dielectric layer is shaped like a ring to surround the via hole.

2. A thin-film capacitor element according to claim 1, wherein an area between the dielectric layer and the via hole is ring shaped.

3. A thin-film capacitor element according to claim 1, wherein the insulative substrate is made of low-temperature-sintered ceramic.

4. A thin-film capacitor element according to claim 1, wherein the entire circumference of the lower electrode is not covered by the dielectric layer and the entire circumference of the dielectric layer is not covered by the upper electrode.

5. A thin-film capacitor element according to claim 1, wherein the lower electrode and a portion of the upper electrode surrounding the area that connects to the end face of the conductive material contact the insulative substrate.

6. A thin-film capacitor element according to claim 5, wherein the dielectric layer is disposed on the insulative substrate between the lower electrode and the portion of the upper electrode that contacts the insulative substrate.

* * * * *